United States Patent [19]
Siek et al.

[11] Patent Number: 6,167,541
[45] Date of Patent: Dec. 26, 2000

[54] METHOD FOR DETECTING OR PREPARING INTERCELL DEFECTS IN MORE THAN ONE ARRAY OF A MEMORY DEVICE

[75] Inventors: David D. Siek; Tim G. Damon, both of Boise, Id.

[73] Assignee: Micron Technology, Inc., Boise, Id.

[21] Appl. No.: 09/047,760

[22] Filed: Mar. 24, 1998

[51] Int. Cl.[7] .................................................. G11C 29/00
[52] U.S. Cl. .......................................... 714/719; 257/296
[58] Field of Search .................................. 714/719, 718, 714/720; 257/296

[56] References Cited

U.S. PATENT DOCUMENTS

| | | | |
|---|---|---|---|
| H1741 | 7/1998 | Cruts | 714/719 |
| 4,460,999 | 7/1984 | Schmidt | 714/711 |
| 4,586,178 | 4/1986 | Bosse | 714/711 |
| 4,627,053 | 12/1986 | Yamaki et al. | 714/711 |
| 4,639,915 | 1/1987 | Bosse | 714/711 |
| 4,736,373 | 4/1988 | Schmidt | 714/711 |

(List continued on next page.)

OTHER PUBLICATIONS

Lu, et al., (Explosion of Poly–Silicide Links in Laser Programmable Redundancy for VLSI Memory Repair, IEEE, 1989).

Kirihata, et al., (Flexible Test Mode Approach for 256–Mb DRAM, IEEE, 1997).

Takanami, et al., (Reconfigurable Fault Tolerant Binary Tree–Implementation in Two–Dimentional Arrays and Reliabiltiy Analysis, IEEE, 1994).

Chang, et al., (Loop–Based Design and Reconfiguration of Wafer–Scale Linear Arrays with High Harvest Rates, IEEE, 1991).

Al–Assadi, et al., (Modeling of Intra–Cell Defects in CMOS SRAM, IEEE, 1993).

Dufot, et al., (Test Vehicle for a Wafer–Scale Field Programmable Gate Array, IEEE, 1995).

*Primary Examiner*—Albert De Cady
*Assistant Examiner*—Guy Lamarre
*Attorney, Agent, or Firm*—Dorsey & Whitney LLP

[57] ABSTRACT

A method of testing a memory device having two arrays of memory cells arranged in rows and columns. Sense amplifiers for respective columns are shared by the arrays, with the sense amplifiers being selectively coupled to the digit lines of respective columns in each array by respective isolation transistors. Cells of the memory array are tested by first writing known data bits to each of the cells. The isolation transistors for the first array are then turned on, and the isolation transistors for the second array are turned off. Predetermined voltages are coupled to the sense amplifiers through the digit lines of the first array by activating a row in the first array. A plurality of rows in the first array are then activated to couple the memory cells in each activated row to respective digit lines. The sense amplifiers are then coupled to respective digit lines in the second array by turning on the isolation transistors for the second array. A plurality of rows in the second array are then activated to couple the memory cells in each activated row to respective digit lines of the second array. The rows in the first and second arrays remain activated for a testing interval of sufficient duration to allow charge to transfer through any inter-cell defects between the cells in the activated rows and cells that are not in an activated row. The cells that are not in an activated row are then read to determine if the data originally written to the cells was altered by charge flowing through inter-cell defects. Inter-cell defects may also be repaired by activating the rows in the first and second arrays in a manner that couples adjacent memory cells to digit lines having different complimentary voltages.

17 Claims, 8 Drawing Sheets

U.S. PATENT DOCUMENTS

| | | | |
|---|---|---|---|
| 4,833,652 | 5/1989 | Isobe et al. | 365/201 |
| 5,107,459 | 4/1992 | Chu et al. | 365/63 |
| 5,159,415 | 10/1992 | Min | 257/296 |
| 5,199,034 | 3/1993 | Yeo et al. | 714/719 |
| 5,268,870 | 12/1993 | Harari | 365/185.09 |
| 5,291,045 | 3/1994 | Atsumi | 257/296 |
| 5,363,382 | 11/1994 | Tsukakoshi | 714/719 |
| 5,541,862 | 7/1996 | Bright et al. | 714/28 |
| 5,561,671 | 10/1996 | Akiyama | 714/799 |
| 5,577,050 | 11/1996 | Bair et al. | 714/710 |
| 5,631,868 | 5/1997 | Termullo et al. | 365/200 |
| 5,671,185 | 9/1997 | Chen et al. | 365/200 |
| 5,694,359 | 12/1997 | Park | 365/185.09 |
| 5,701,270 | 12/1997 | Rao | 365/230.03 |
| 5,748,872 | 5/1998 | Norman | 395/182.09 |
| 5,801,412 | 9/1998 | Tobita | 257/296 |
| 5,835,409 | 11/1998 | Lambertson | 257/296 |
| 5,866,928 | 2/1999 | Seik | 257/296 |
| 5,883,899 | 3/1999 | Dahlman et al. | 714/790 |
| 5,898,742 | 4/1999 | Van Der Werf | 714/700 |
| 5,917,211 | 6/1999 | Murata et al. | 257/296 |
| 5,920,575 | 7/1999 | Gregor et al. | 714/726 |
| 5,956,275 | 9/1999 | Duesman | 365/200 |
| 5,958,075 | 9/1999 | Wendell | 714/726 |
| 5,983,366 | 11/1999 | King | 395/183.14 |
| 5,991,907 | 11/1999 | Stroud et al. | 714/725 |
| 6,014,762 | 1/2000 | Sanghani et al. | 714/718 |
| 6,026,010 | 2/2000 | Ema et al. | 365/149 |
| 6,111,947 | 12/1999 | Minne et al. | 437/228 |

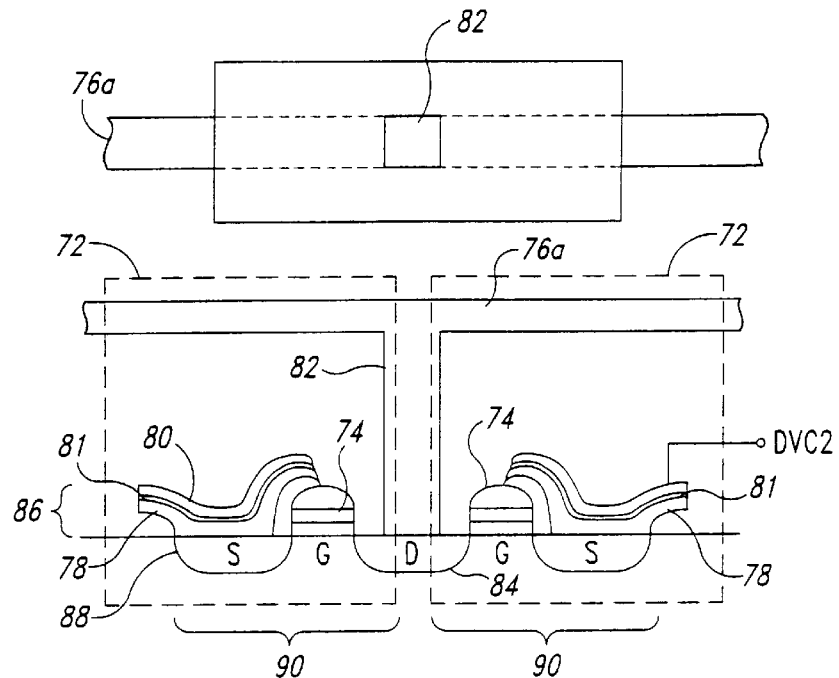
Fig. 4
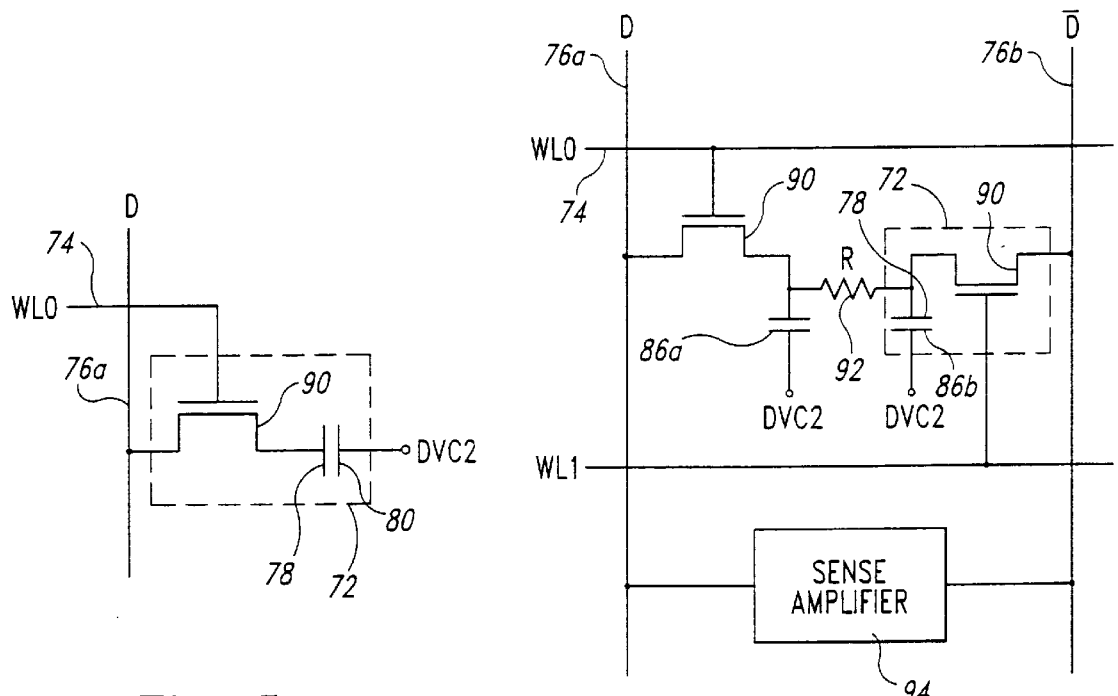
Fig. 5
Fig. 6

METHOD FOR DETECTING OR PREPARING INTERCELL DEFECTS IN MORE THAN ONE ARRAY OF A MEMORY DEVICE

TECHNICAL FIELD

The present invention relates to integrated circuit devices, and more particularly, to methods and structures for testing or repairing more than one memory array or section of a memory array in a memory device.

BACKGROUND OF THE INVENTION

Various types of defects and failures can occur during the manufacture of semiconductor devices. A "failure" occurs when a semiconductor device fails to meet specifications. A "defect" occurs when a semiconductor device has an improper circuit structure that currently presents a failure of the device, or has the potential to cause failure during the expected lifetime of the device. In a memory device for example, manufacturing errors may produce a polysilicon residue or "stringer" between a pair of adjacent memory cells. The stringer provides a current path between the adjacent cells so that a "low" voltage written to one cell lowers a "high" voltage on the adjacent cell, resulting in incorrect data being stored in the memory device.

Testing is performed on semiconductor devices to locate such defects and failures. As circuit density on semiconductor devices increases, the number of defects and failures can increase. Semiconductor manufacturers, therefore, have an increasing need to detect defects and failures in semiconductor devices.

Dynamic random access memory devices ("DRAMs") are one type of device on which such tests are performed. DRAMs typically include one or more arrays of memory cells that are each arranged in rows and columns. Word or row lines extend along each of the rows to enable all of the memory cells along the row. Bit, digit, or column lines (or pairs of lines) extend along the columns of the array to select individual memory cells along a row which data is to be read from or written to.

During testing, predetermined data or voltage values are applied to selected row and column addresses to store or "write" data in corresponding memory cells. Then, voltage values are read from such memory cells to determine if the data read matches the data written to those cells. If the read data does not match the written data, then the memory cells at the selected addresses likely contain defects, and the semiconductor devices fail the test.

A person testing several die on a wafer can then examine a particular die by means of a microscope to determine if failures occurred from masking defects, defects during the deposition of certain layers, and so forth. During the initial development of a semiconductor device, and while the device is in die form, changes to masks or reticules or the fabrication process can be made to compensate for most detected failures. Once a semiconductor device is in production, redundant circuitry on the semiconductor device can be employed to replace certain failed components. Such redundant circuitry cannot always replace all failed components, and therefore, some failed devices must generally be discarded.

To increase the yield of acceptable devices, semiconductor manufacturers try to rapidly test the devices for defects before shipping them to a vendor or user. The semiconductor devices are often tested by automated testing circuitry that applies predetermined voltages and signals to the chip, writes test patterns to the chip, and analyzes the results therefrom to detect failures in the chip.

Returning to the above-described problem of stringers between adjacent cells, the conductive path formed by such stringers may have a high resistance. The low voltage on a first cell will then take an extended period to decrease a high voltage placed on an adjacent second cell. Therefore, such intercell defects may not be revealed by tests that read the voltage of the second cell shortly after writing voltage to the first cell. As a result, after applying a voltage to the first cell, automated testing circuitry must wait before looking for voltage changes at the adjacent cell. Typical wait times, or "testing intervals," between writing to the first cell and reading from the second cell are 48–64 msec. If such a procedure were applied sequentially to each cell in the memory array, testing of devices would take over 10 hours for every million cells. The cost of such testing would be prohibitive.

One approach to reducing the time for testing such devices is to prewrite an entire row of the memory array to logic states such that all of the cells in the first row are at a high voltage. Then, an adjacent row is written to logic states such that all of the cells in the adjacent row are at low voltages. Then, after the testing interval, the data in the second row are read to see if any current leakage has caused changes in the cell voltages.

During the testing interval, the charge leaking to the second row's cells from the first row's cells must be removed as will now be explained with reference to FIG. 1. As shown by the upper broken line in FIG. 1, if the leaking charge to the cells in the second row is not removed, the voltage $V_{LOW}$ of the low voltage cell will rise as the voltage $V'_{HIGH}$ of the high voltage cell falls. The two voltages will asymptotically approach a voltage DVC2, which is approximately halfway between $V_{CC}$ and $V_{REF}$, assuming equal capacitance of the cells. As a result, the low voltage cell remains below the voltage DVC2 and the high voltage cell remains above the voltage DVC2. When the high voltage cell is coupled to its respective digit line (which is precharged to DVC2) for reading, the high voltage VMGH will pull the digit line up. A sense amplifier coupled between the digit line and an adjacent complementary digit line and will read the data as unchanged, even though a stringer is present. Consequently, the defect will not be identified.

To overcome this problem, the second word line remains active over the first testing interval. Because the second word line is active, the low digit lines (kept low by the sense amplifiers) remove any charge leaking from the cells in the first row thus, as represented by the solid lines in FIG. 1, the low cell voltage $V_{LOW}$ remains low, and the voltage on the capacitor of the high voltage cell falls asymptotically toward the low voltage and eventually becomes less than the precharge voltage DVC2.

At the end of the testing interval, the second row is deactivated to isolate the cells from the digit lines and the digit lines are equilibrated. Then, data are read from the cells of the first row.

If stringers couple any of the originally activated cells of the second row to the cells in the first row, the cells in the first row will discharge to a low state. Consequently, one or more cells in the first row will contain incorrect data. Therefore, the data read from the first row will indicate the presence or absence of intercell defects.

After data are read from the first row, data are written to all of the cells in third and fourth rows so that the cells contain opposite voltage levels. The third row is then read to set the digit line voltages. Again the sense amplifiers remain ON for the entire testing interval to hold the digit line voltages constant. After the testing interval, the third row is turned OFF and data are read from the cells in the fourth row to see if all of the data are unchanged. The above-described process is repeated until all of the rows of the array have been either written to or read from.

In the above-described process, all of the even rows (starting from row 0) are activated and all of the odd rows are read. This process test of intercell defects between only half of the adjacent row combinations. For example, the process does not identify intercell defects between the second and third rows. Therefore, the process is typically repeated by writing data to all of the odd rows and reading data from the immediately subsequent even rows.

For a memory array having two banks of 4,096 rows and using 64 msec read intervals, each of the above-described passes would take at least 262.14 secs. The overall time to test all of the rows is then at least 524.28 secs, or over eight minutes per memory array. While the time savings in the above approach are significant as compared to the approach of individually activating each cell in sequence, a testing time of over four minutes per part is significant. Also, this time roughly doubles when an analogous test procedure is applied to detect intercell defects between columns, assuming a 4096 by 4096 array (i.e., a 16 M bit device). Moreover, the time consumption will continue to increase as the number of cells in the memory array or the number of arrays or sub-arrays in the memory device increases.

In the above-described testing procedure, only half of the rows (i.e., all odd rows or all even rows) are activated at the same time. By activating all of the rows at the same time, intercell defects can be repaired. More specifically, if the memory cells in adjacent rows are coupled to different digit lines for the same column, then one memory cell will receive a voltage such as $V_{CC}$ and the other memory cell will receive zero volts. The voltage across a stringer will often be successful to blow or open circuit the stringer.

Although it may be possible to turn on all of the rows at the same time, it will normally be necessary to turn on the rows in a sequence to avoid excessive current flow through the digit lines.

SUMMARY OF THE INVENTION

A method and structure identifies intercell defects and repairs intercell defects in a memory array having a plurality of memory arrays in one or more banks that share one or more sense amplifiers. According to one embodiment of the method, the voltage of a first digit line in a first array is sensed with a sense amplifier that drives the first digit line and its complement to respective voltages. The memory cells in the first array are tested by activating half of the rows at a time using the above-described procedure. Isolation transistors connected between the sense amplifiers and the digit lines of the second array are then turned on to couple the sense amplifiers to the digit lines of the second array. The second array is then tested using the above described procedure. Alternately, the isolation transistors may be turned on before the rows of the array are activated, and half of the rows in both arrays are then activated at the same time with the ON isolation transistors coupling the digit lines in both arrays to each other. Intercell defects in the first array may also be repaired by turning on all of the rows in the first array. The isolation transistor can then be turned on to couple the sense amplifier to the second array to allow repair of intercell defects in the second array.

BRIEF DESCRIPTION OF THE DRAWINGS

FIG. 4 is a side cross-sectional and top plan view of an integrated cell pair.

FIG. 5 is a schematic of an individual cell of the device of FIG. 2.

FIG. 6 is a schematic of two adjacent cells with an equivalent resistance representing a defect extending between the two cells.

DETAILED DESCRIPTION OF THE INVENTION

Figure 2:
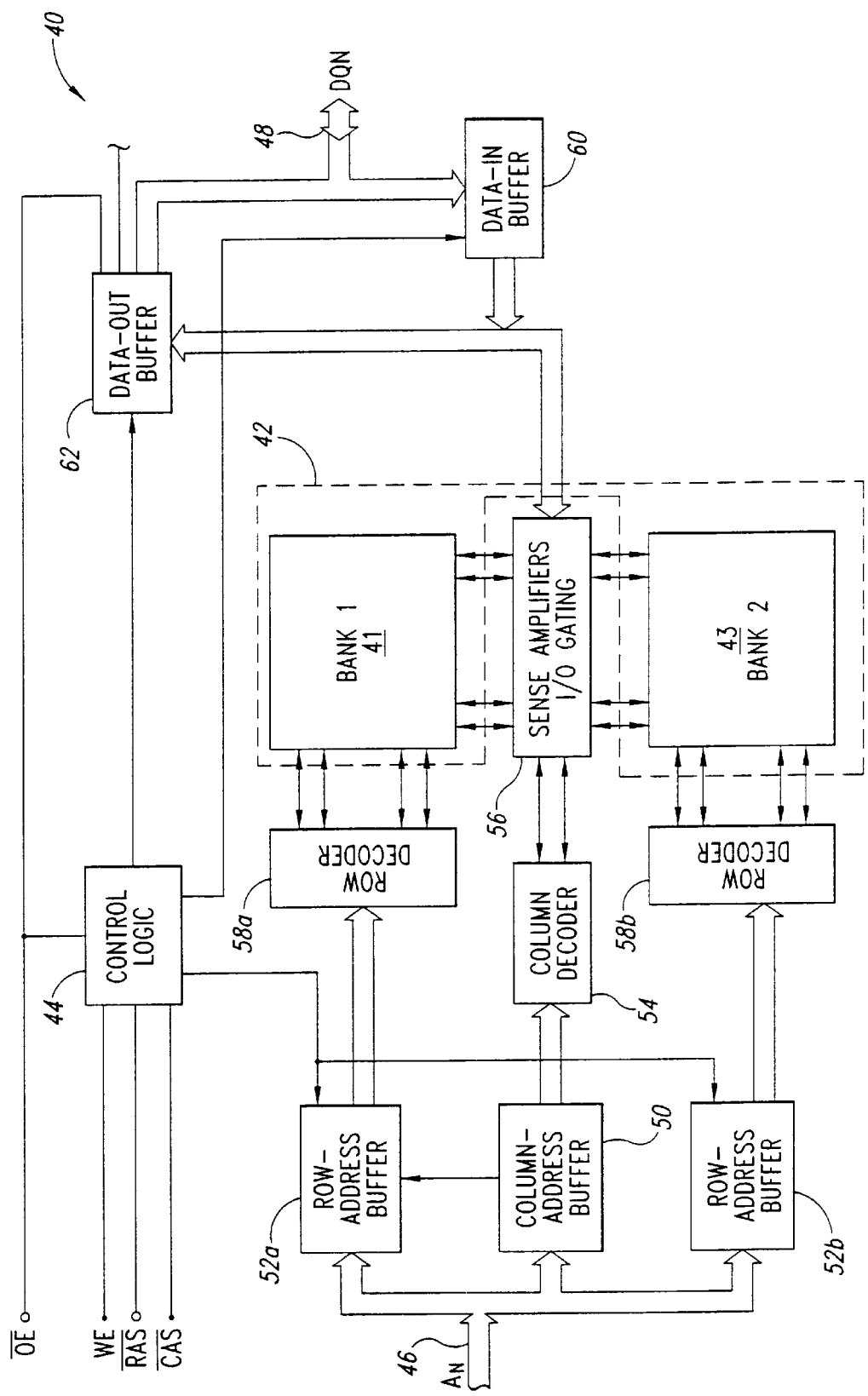
FIG. 2 is a block diagram of a conventional integrated memory device having two memory banks.

As shown in FIG. 2, a memory device 40 includes as its central storage element a memory array 42 that includes two banks 41, 43. The device 40 may be a synchronous or asynchronous dynamic random access memory (DRAM), a packetized DRAM memory or any of several other known types of memory devices. The memory device 40 operates under control of a control logic circuit 44 responsive to externally supplied commands that control reading from and writing to the memory device 40. The control logic circuit 44 may be conventional control logic in a DRAM or may be a command sequencer and decoder in a packetized memory. One skilled in the art will recognize that, where the device 40 is a DRAM, as shown in FIG. 2, the commands are formed from a combination of command signals, such as a write enable signal WE, a column address strobe signal $\overline{CAS}$, a row address strobe signal $\overline{RAS}$ and an output enable signal $\overline{OE}$. The overbars for the strobe signals $\overline{CAS}$ and $\overline{RAS}$ and output enable signal $\overline{OE}$ indicate that these signals are low-true signals, i.e., the strobe signals $\overline{CAS}$, $\overline{RAS}$ and output enable signal $\overline{OE}$ go to a low logic level when true. Where the device 40 is a packetized memory, the commands may be command data within a control data packet.

In addition to the command signals, the memory device 40 also receives and outputs data on a data bus 48 and receives addresses from an address bus 46. The received addresses may be row or column addresses. Typically, one or more bits of the received address identify the bank to be addressed. If an address is a column address, the address is stored in a column address buffer 50. If the address is a row address, the address is stored in a row address buffer 52a, b for a respective bank 41, 43.

Addresses stored in the column address buffer 50 are forwarded to a column decoder 54 that decodes the addresses and provides the decoded addresses to an I/O interface 56. The I/O interface 56 is coupled between the two banks 41, 43 and includes I/O elements such as sense amplifiers, precharge and equilibration circuitry, and input and output gating, as will be discussed in greater detail below. The I/O interface 56 allows the logic controller 44 to control reading from or writing to the banks 41, 43 in response to the command signals WE, $\overline{\text{CAS}}$, $\overline{\text{RAS}}$, and $\overline{\text{OE}}$.

If an address received at the address bus 46 is a row address, the row address buffers 52*a*, *b*, under control of the logic control circuit 44, transmit the row address to a respective row decoder 58*a*, *b*. The row decoders 58*a*, *b* decode the row address and activate a corresponding row of a respective one of the banks 41, 43 in response.

For write operations, data are received at the data bus 48 and stored in a data input buffer 60. When the logic control circuit 44 determines that the I/O interface 56 is available, the logic controller 44 activates the input data buffer 60 to transfer the input data to the I/O interface 56. As will be discussed below, the I/O interface 56 responds to the decoded column address from the column decoder 54 and the input data from the input data buffer 60 to write data to the corresponding locations in the respective bank 41, 43.

If the logic control circuit 44 determines that an operation is a read operation, the I/O interface 56 reads data from the location identified by the decoded column address in the respective bank 41, 43 and transfers the read data to an output data buffer 62. In response to the output enable signal $\overline{\text{OE}}$, the output data buffer 62 makes the output data available at the data bus 48.

Figure 3:
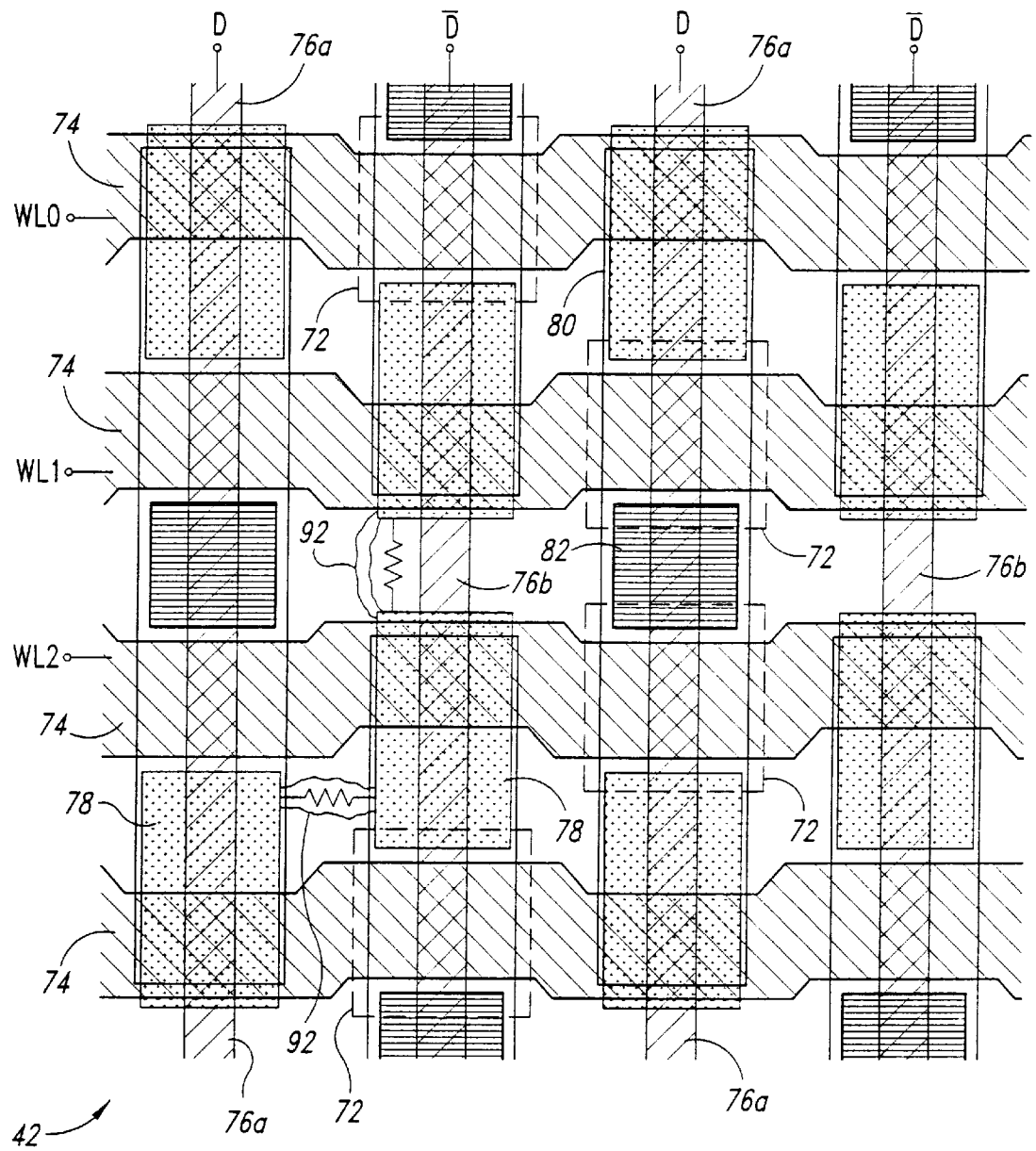
FIG. 3 is a top plan view of a section of a memory array within the device of FIG. 2 showing intersecting row and column lines and corresponding active areas defining cells of the memory array.

Turning now to FIG. 3, the memory array 42 is formed in a silicon substrate by row or "word" lines 74, column or "digit" lines 76, and integrated cells 72. Alternating the digit lines 76 are respective complementary digit lines 76*a,b*. The digit lines 76*a* correspond to a digit signal D, while the complementary digit lines 76*b* correspond to the complement $\overline{\text{D}}$ of the digit signals D. The individual cells 72 are located at each intersection of a respective word line 74 and digit line 76*a,b*.

As can be seen in the cross-sectional view of FIG. 4, each of the cells 72 includes a respective storage capacitor 86 formed from a storage plate 78 and a reference plate 80 separated from each other by a dielectric layer 81. Each of the cells 72 also includes a switching transistor 90 coupled between the storage capacitor 86 and a corresponding digit line 76*a*. A conductive via 82 couples each digit line 76*a* to a drain region 84 that forms the drains of two adjacent cells 72. The source of the switching transistor 90 is coupled directly to the storage plate 78, and the gate of the switching transistor 90 is coupled to the corresponding word line 74. As shown in FIG. 4, the storage plate 78 is formed directly atop the source 88 of the integrated cell's transistor 90. However, a variety of other plate structures, such as "T-shaped" plates may be used.

The equivalent circuit of the left uppermost cell is shown in FIG. 5 where the gate of the switching transistor 90 is controlled by a first word signal WL0 and the reference plate 80 is coupled to a reference voltage DVC2. In normal operation, when the first word line signal WL0 is high, the switching transistor 90 is ON, coupling the storage plate 78 to the digit line 76*a*. The storage plate 78 is thus charged or discharged through the switching transistor 90 until the voltage of the storage plate 78 equals the voltage of the digit line 76*a*. If a "1" is to be written to the cell 72, the digit line 76*a* is driven with a high digit signal D to charge the storage plate 78 to a high voltage. If a "0" is to be written to the cell 72, the digit line 76*a* is driven by a low digit signal D to pull the voltage of the storage plate 78 low.

Returning to FIG. 3, one possible defect which can occur in the structure of FIG. 3 is a stringer 92. Stringers are typically conductive regions that extend between adjacent storage plates 78 forming a resistive path therebetween. Usually, stringers are the result of incomplete removal of the cell plate conductor during patterning of the storage plates 78.

As shown in the equivalent circuit of FIG. 6, the stringer 92 forms a resistive path having a resistance R between the storage plates 78 in adjacent rows. A failure due to the stringer 92 may occur when the cells 72 in adjacent rows are written to the same state, e.g., a "1", so that different voltages are stored on the capacitors 86*a* and 86*b*. More specifically, if a "1" is written to the left cell 72, the storage plate 78 of the left cell stores a high voltage, as described above. If a "1" is written to the right cell 72, the storage plate 78 of the right cell 72 stores a low voltage. The above discussion assumes that adjacent cells are coupled to complementary digit lines D, $\overline{\text{D}}$. One skilled in the art will recognize that to produce opposite voltages on the capacitors 86*a*, 86*b*, the specific data written to each of the cells 72 may be of opposite logic states for memory structures where adjacent cells are coupled to the same digit line D or $\overline{\text{D}}$. The voltage difference between the two storage plates 78 causes current to flow through the stringer 92 until the voltages of the storage plates 78 are equal.

Figure 1:
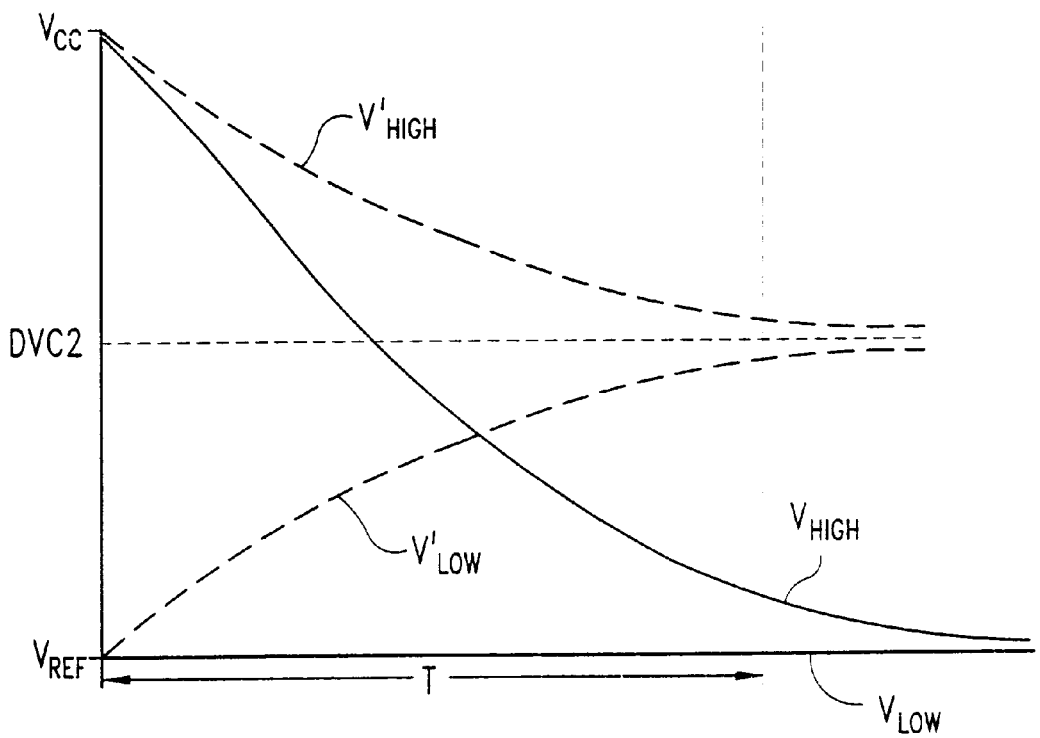
FIG. 1 is a voltage diagram showing voltages on two adjacent cells where the solid lines show voltages when low voltage is sustained and where the broken lines show voltages when the low voltage is allowed to rise.

The storage plate voltages do not equalize immediately. Instead, charge transfers according to the RC time constant of the stringer resistance R and the capacitances of the storage capacitors 86, as shown in FIG. 1. Typically, the time for equalization of the voltages is much less than 64 msec. Therefore, testing for such stringers over a 64 msec period is suitable for the tests described below.

To test coupling between adjacent cells, data corresponding to a low voltage, i.e., 0 volts or ground, is written to the left cell 72 and data corresponding to a high voltage $V_{CC}$ is written to the adjacent cell. Then, the second word line WL1 is pulled low to turn OFF the right transistor 90, thereby isolating the storage cell 86*b* from the complementary digit line $\overline{\text{D}}$.

Next, the first word line signal WL0 is set high to turn ON the left transistor 90 thereby coupling the left storage plate 78 to the digit line 76. A sense amplifier 94 (see FIG. 7) sets the digit signal D low and the complementary digit signal $\overline{\text{D}}$ high in response. Unlike a normal read operation, the first word line signal WL0 remains high long after the left sense amplifier 94 sets the digit line voltages. This allows the digit line 76*a* to continuously discharge the left capacitor 86*a*, thereby removing any charge that leaks through the stringer 92 from the right capacitor 86*b*, as described above with reference to FIG. 1. After a suitable period, such as approximately 64 msec, the first word line WL0 returns low to turn OFF the left transistor 90. Then, the digit lines 76*a,b* are equilibrated, and the second word line WL1 is set high, turning ON the right transistor 90 to read data from the right cell 72. The data are output to the output data buffer 62 through the I/O interface 56 (FIG. 2). If the output data from the right cell 72 is a "0," a defect (i.e., a stringer) is identified. As noted above, the above operation takes about 64 msec. Therefore, if each cell pair were to be tested separately, the testing period would be prohibitively long.

To reduce the overall testing time, it is conventional to test several cell pairs simultaneously. One approach to simultaneously testing more than one adjacent cell will now be described with reference to FIG. 7, where the reference plates 80 are removed to reveal the active areas of the cells 72 and where the word lines 74 and digit lines 76 are represented as narrow lines for clarity of presentation. Each of the cells 72 also includes two index numbers in an upper comer indicating the relative location of the cell 72 in the matrix, where the first index number indicates the corresponding digit line 76 and the second number represents the corresponding word line 74 (each starting at "0"). For example, the left uppermost cell is coupled to the first digit line 76 and the first word line 74. Therefore, the left uppermost cell is the 0,0 cell 72.

Figure 7:
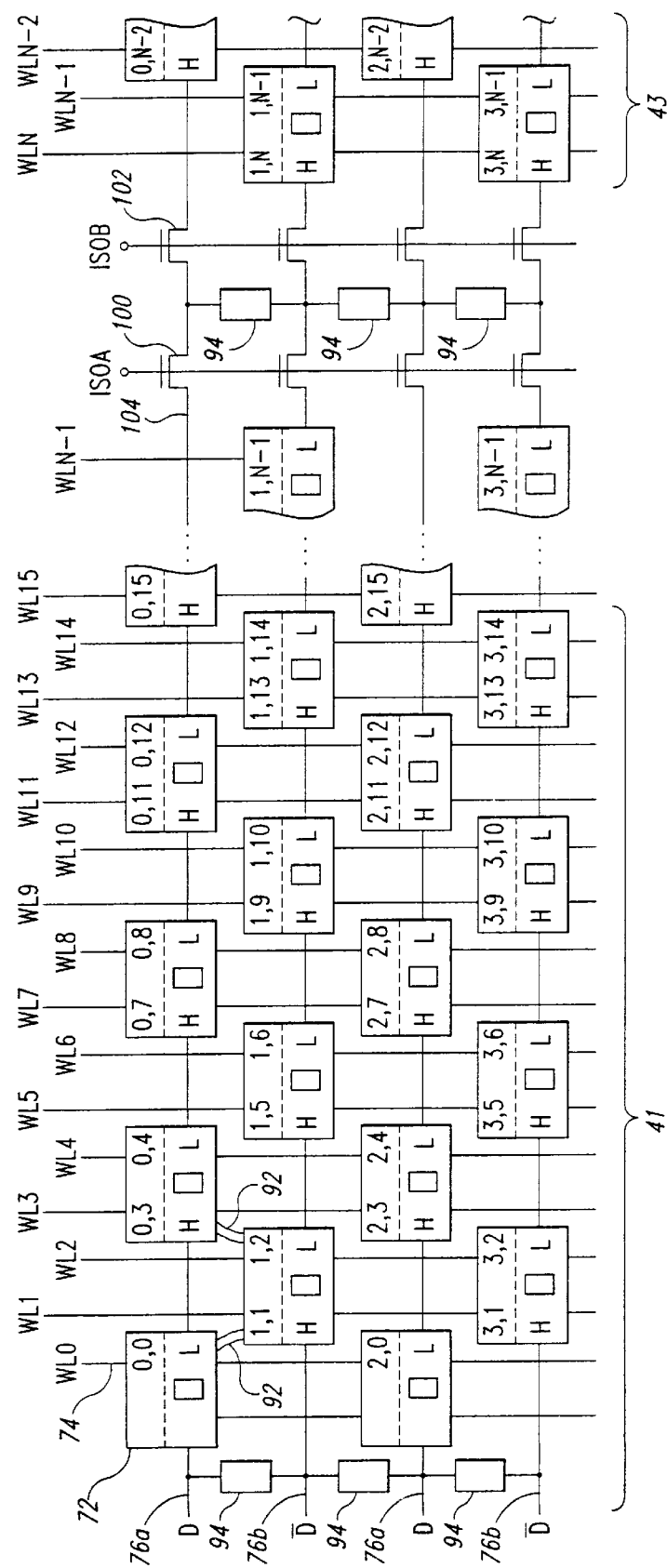
FIG. 7 is a diagrammatic representation of data written to the memory array of FIG. 2 showing data of opposite states written to adjacent rows.
Figure 8:
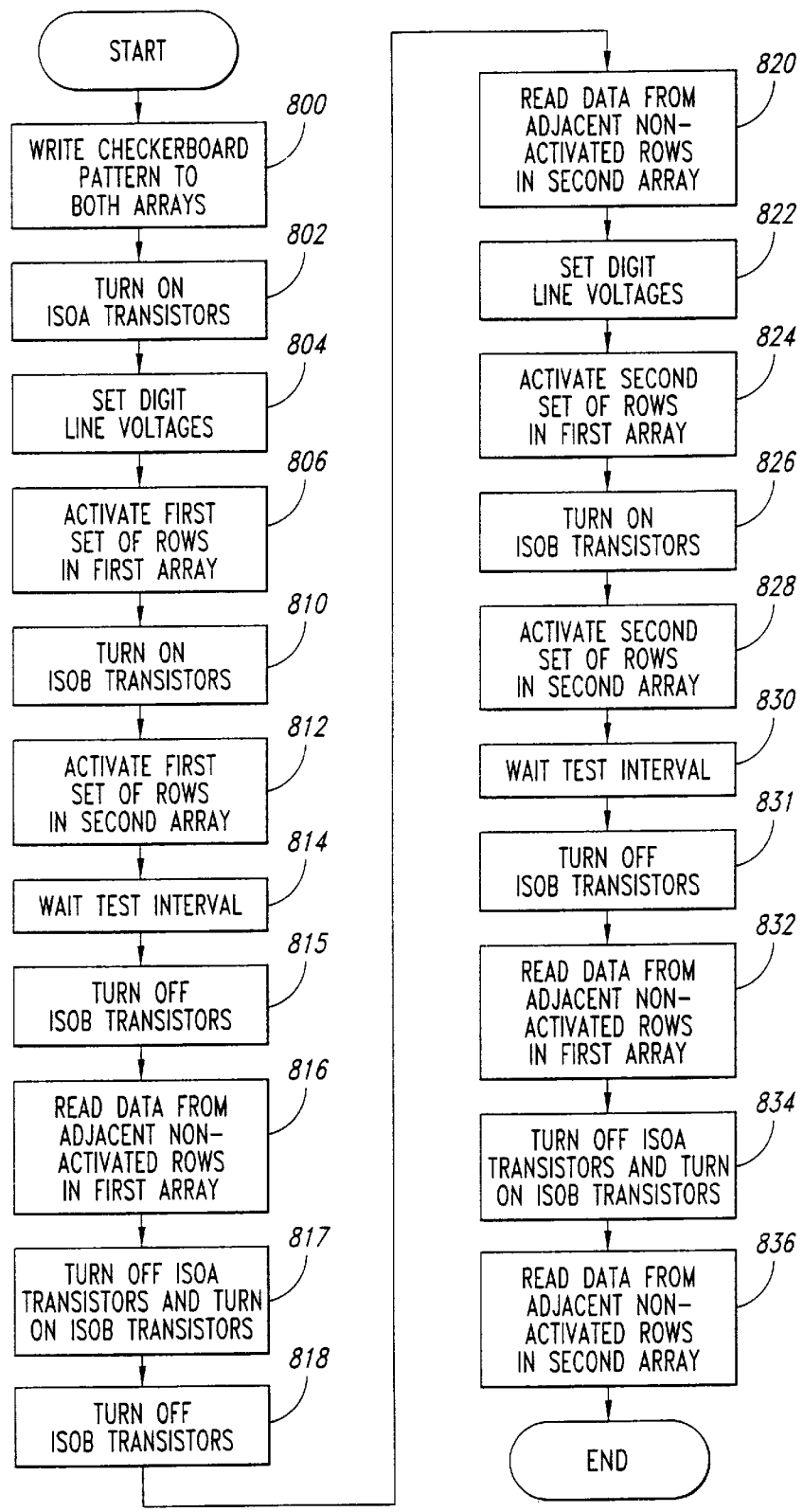
FIG. 8 is a flowchart presenting a method of testing intercell defects in the array of FIG. 7 according to one embodiment of the invention.

As shown in FIG. 7 and in step 800 of FIG. 8, to initiate testing in accordance with one embodiment of the invention, each sub-array 41, 43 of the memory array 42 is prewritten to a "checkerboard" pattern. In a checkerboard pattern, the cells 72 of the memory array 42 are written in an alternating pattern of high and low voltages, such that each cell 72 of first voltage level (e.g., $V_{CC}$) is surrounded by cells 72 of a complementary voltage level (e.g., GND) as represented by "H" and "L" in FIG. 7. For example, the [1,6] cell contains GND and is surrounded by the [1,5], [0,7], [1,9], [2,7] cells that each contain $V_{CC}$.

Next, at step 802, the ISOA line is driven high to turn on the isolation transistors 100 thereby coupling the sense amplifiers 94 to the digit line and complementary digit line. In normal operation, the isolation transistors 100 can be either normally on or normally off. For isolation transistors 100 that are normally on, they are turned off just before the wordlines are activated.

In step 804, the digit lines are set at complementary voltages by activating one of the rows. For example, activating row 0 places 0 volts on all of the digit lines and $V_{CC}$ on all of the complementary digit lines.

Next, a first set rows is activated at 806 to couple the memory cells 72 in the first set of rows to either the digit lines or the complementary digit lines. It is this step 806 that the arrays are first operated in a test mode rather than the normal operating mode. The rows are activated so that a memory cell that is to store a low voltage is coupled to a digit line while a memory cell that to store a high voltage is coupled to a complementary digit line. Also, memory cells in adjacent rows that would store different voltages are not activated at the same time. For the embodiment shown in FIG. 7, the first set of rows will include rows 0, 4, 8, etc. However, the rows selected for inclusion in the first set for other array configurations will depend upon the manner in which the memory cells in the row are coupled to the digit and complimentary digit lines.

It may be possible to activate all of the rows in the first set simultaneously. However, doing so will normally exceed the current capacity of the sense amplifiers 94. Therefore, it is preferable to activate the rows in the first set either sequentially or in relatively small groups.

With further reference to FIG. 8, the ISOB line is driven high at step 810 to couple the sense amplifiers 94 to the digit lines of the second array 43. A first set of rows is then activated at step 812 in the same manner that the first set of rows in the first array 41 was activated at step 806. Thus, the rows in the first set are preferably activated in a sequence or in small groups.

Next, the memory arrays 41, 43 remain in a stable condition at step 814 for a test interval of sufficient duration for charge to leak through any intercell defects between a memory cell 72 in a non-activated row and a memory cell 72 in an activated row. This test interval consumes a relatively large percentage of the test procedure illustrated in FIG. 8. However, by performing this step simultaneously for both arrays 41, 43, the time required to conduct the test procedure illustrated FIG. 8 is reduced almost in half as compared to the conventional procedure described above. The reason that the conventional test procedure requires almost twice as much time is that, in the conventional procedure, step 814 is conducted on each array 41,43 separately.

At the conclusion of the test interval in step 814, the ISOB transistors are turned off at step 815, and data are read in step 816 from a second set of memory cells in the first array 41. The set of memory cells from which data are read at step 816 includes the memory cells in the rows that were not activated and that are adjacent the memory cells that were activated in step 806. In the embodiment illustrated in FIG. 7, data would be read from the memory cells in rows 1, 3, 5, 7, 9, 11, 13, etc. It is these memory cells to or from which charge may have leaked in the event there are intercell defects. Thus, if any of the cells contain data different from the data written to those cells in step 800, an intercell defect associated with that memory cell is assumed to be present. Next, at step 817, the ISOA transistors 100 are turned off and the ISOB transistors 102 are turned on to allow data to be read from the second array 43. Data are then read from the memory cells in the second array 43 in step 818 in the same manner and for the same reason that data were read from the memory cells in the first array 41 in step 816, as explained above.

After data have been read from the non-activated memory cells in both arrays 41, 43, the ISOB line is driven low in step 820 to isolate the sense amplifiers 94 from the digit lines in the second array 43. The voltages on the digit lines and complementary digit lines are then set to the opposite polarity at step 822 by coupling a memory cell storing a high voltage to the digit line or a memory cell storing a low voltage to the complementary digit line. For example, row 3 can be activated to accomplish this function. The digit line will then be at a high logic level and the complementary digit line will be at a low logic level.

A second set of rows in the first array 41 is then activated at step 824. The rows in the second set are the rows coupled to memory cells 72 that were not previously coupled to a memory cell 72 for an activated row. Thus, for the embodiment illustrated FIG. 7, the second set will include rows 2, 6, 10, 14, etc. After the ISOB line is driven high to couple the sense amplifiers 94 to the second array at step 826, the second set of rows in the second array 93 are activated at step 828.

Next, at step 830, the arrays 41, 43 remain in a stable condition for a test interval to allow charge to leak through any intercell defects between the memory cells in the activated rows and the adjacent memory cells. Thus, for example, charge would leak through any intercell defect between a memory cell 72 in row 8 and a memory cell 72 and rows 7 and 9. After the ISOB transistors 102 are turned off at step 831, data are read from the non-activated rows of the first array 41 in step 832. The ISOA transistors 100 are then turned off and the ISOB transistors 102 are turned on in step 834. Finally, data are read from the memory cells in the non-activated rows of the second array 43 in step 836, as explained above.

The above-described test maybe repeated with both arrays 41, 43 initially written to an inverse checker board pattern to detect polarity sensitive intercell defects. For example, the above-described test will allow charge to flow from memory cell 1,5 to memory cell 0,4 since the memory cells in row 4 were coupled in step 814 to a digit line having a low logic level during the test interval. However, the above-described test will not detect stringers that only allow charge to flow from memory cell 0,4 to memory cell 1,5. Initially writing the arrays 41, 43 with an inverse checker board pattern will place a high voltage on the memory cell 0,4 thereby allowing charge to flow from the memory cell 0,4 to the memory cell 1,5.

Figure 9:
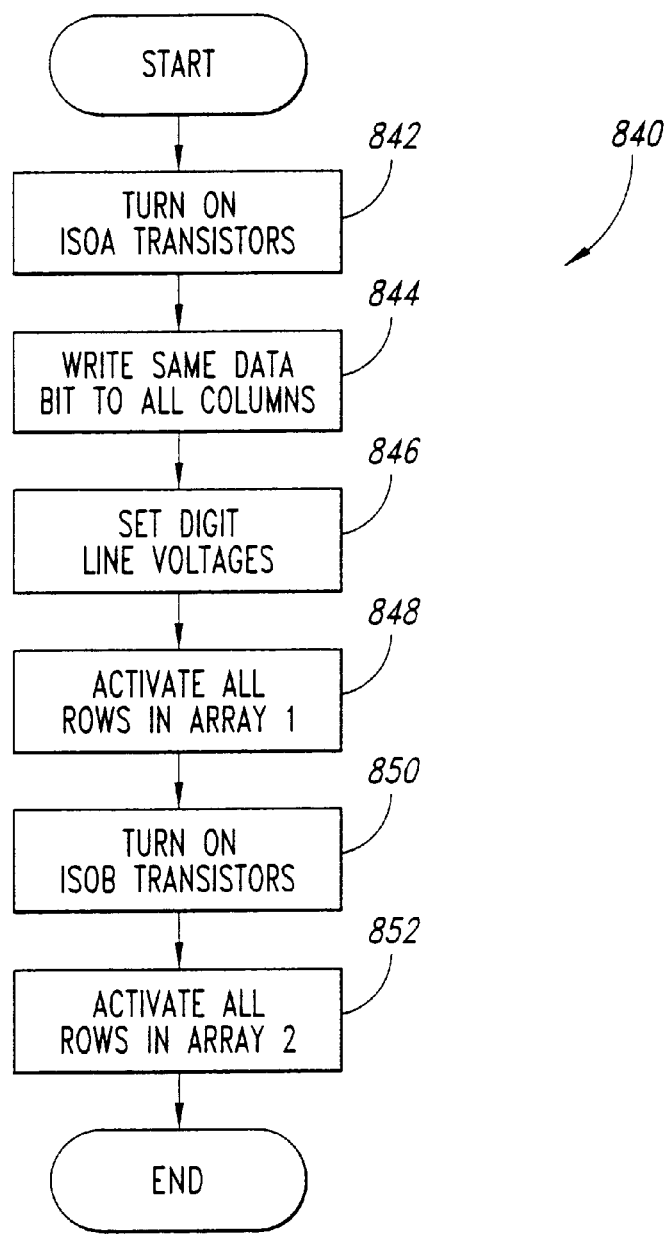
FIG. 9 is a flowchart presenting a method of repairing intercell defects in the array of FIG. 7 according to one embodiment of the invention.

A procedure 840 for repairing intercell defects in accordance with one embodiment of the invention is illustrated in FIG. 9. The ISOA line is driven high at step 842 to turn on the isolation transistors 800. Next, at step 844, the same data bit is written to each column of one row of the first array 41. By way of example, it will be assumed that a logic "0" is written to each column in row zero. Next, at step 846, the digit line and complementary digit line voltages are set by the activating row 0, thereby coupling the memory cell in each column of row 0 to be respective digit line 76. As a result, the sense amplifier 94 for each row drives the complementary digit line high. Thus, a low is placed on the digit line for each column and a high is placed on the complementary digit line for each column.

All of the rows in the first array 41 are then activated at step 848. The rows are preferably activated either sequentially or in relatively small groups to limit the current that must be delivered by the sense amplifiers 94. With reference to FIG. 7, the memory cells 72 coupled to the digit line will be at 0 volts and the memory cells coupled to the complementary digit lines will be at $V_{CC}$. As a result, there will be a voltage of $V_{CC}$ across any intercell defect extending between a memory cell 72 coupled to a complementary digit line and a memory cell 72 coupled to a digit line. Under many circumstances, this voltage is sufficient to "blow" or open-circuit the intercell defect. Thus, step 848 will often be successful in repairing into cell defects in the memory array 41. Note, however, although intercell defects between a memory cell 72 coupled to a digit line and a memory cell 72 coupled to a complementary digit line may be repaired, intercell defects between memory cells 72 coupled to the same digit or complementary digit line cannot be repaired since both memory cells 72 will be at the same voltage.

The ISOB line is driven high at step 850 to turn on the isolation transistors 102, thereby coupling the digit lines in the second array 43 to the sense amplifiers 94. All of the rows in the second array 43 are then activated at step 852 to repair intercell defects in the second array 43 in the same manner as explained above with reference to step 848.

Figure 10:
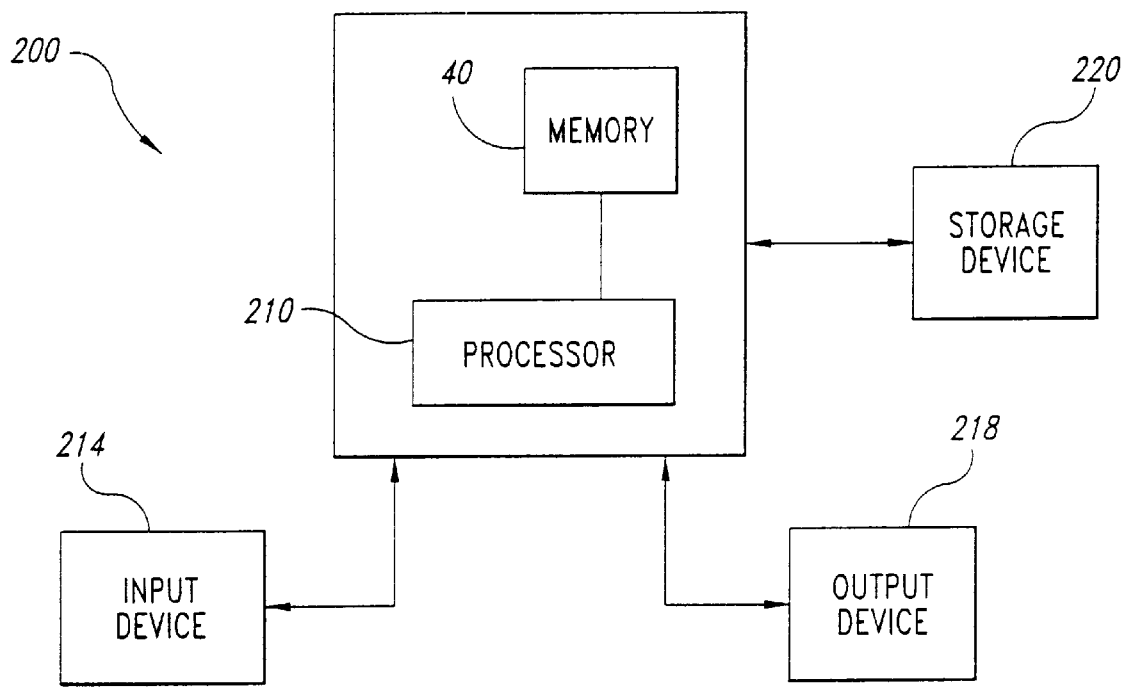
FIG. 10 is a block diagram of a computer system employing a memory device such as the memory device of FIG. 2, that may be tested in accordance with various embodiments of the invention.

FIG. 10 is a block diagram of a computer system 200 that uses the memory device 40 of FIG. 5. The computer system 200 includes a processor 210 for performing computer functions, such as executing software to perform desired calculations and tasks. One or more input devices 214, such as a keypad or a mouse, are coupled to the processor 210 and allow an operator (not shown) to manually input data thereto. One or more output devices 218 are coupled to the processor 210 to provide to the operator data generated by the processor 210. Examples of output devices 218 include a printer and a video display unit. One or more mass data storage devices 220 are preferably coupled to the processor 210 to store data in or retrieve data from the storage device 220. Examples of the storage devices 220 include disk drives and compact disk read-only memories (CD-ROMs). Although the memory device 40 has been shown only as part of a computer system 200, it will be understood that it may also be used in a wide variety of other systems.

From the foregoing it will be appreciated that, although specific embodiments of the invention have been described herein for purposes of illustration, various modifications may be made without deviating from the spirit and scope of the invention. For example, although the sense amplifiers 94 of the exemplary embodiments sustain low voltages on selected cells 72 and later data is read from cells 72 that originally were at high voltages, one skilled in the art will understand that the voltages can be reversed. That is, the sense amplifiers 94 or variable bias circuit 112 can maintain a high voltage on selected cells 72 and data can be read from cells 72 that were originally at low voltages. This may inherently be the case for the second bank 43 where a digit line D in the first bank 41 is coupled to a complementary digit line $\overline{D}$ in the second bank 43. Also, although the isolation transistors 102 of the exemplary embodiment are turned ON after the word lines in the first bank 41 are activated, the isolation transistors 102 can be turned ON before all of the word lines in the first bank 41 are activated. Such an embodiment allows the word lines in the second bank 43 to be activated after the seed row but before activating the remaining word lines in the first bank 41. Moreover, although the embodiment described herein contains two memory banks, the principles and structures described herein are equally applicable to memory devices having more than two banks. Accordingly, the invention is not limited except as by the appended claims.

What is claimed is:

1. A method of testing first and second memory arrays each having a plurality of memory cells arranged in rows and columns, the memory arrays further including a plurality of sense amplifiers shared by the first and second arrays in which each of the sense amplifiers is selectively coupled to a digit line of a respective column in the first and second arrays, the method comprising:

writing a known data bit to each of a plurality of the memory cells that are to be tested in the first and second arrays;

coupling a memory cell in each of a plurality of columns to a respective sense amplifier through a respective digit line of the first array to set the voltage of the digit lines and the sense amplifier for each of the plurality of columns in the first array;

activating a plurality of rows in the first array to apply the voltage set on each digit line to the memory cells in respective activated rows;

coupling each of the plurality of sense amplifiers to respective digit lines of the second array;

activating a plurality of rows in the second array to apply the voltage set on each digit line to the memory cells in respective activated rows;

leaving the digit lines coupled to the memory cells in the activated rows of the first and second arrays for a period of sufficient duration to transfer charge through any inter-cell defects between the memory cells in the activated rows and at least some of the memory cells that are not in the activated rows; and reading data from at least some the memory cells that are not in the activated rows.

2. The method of claim 1 wherein the step of activating a plurality of rows in the first and second arrays comprises activating each of the rows in a sequence with only a single row being activated at a time.

3. The method of claim 1 wherein the step of activating a plurality of rows in the first and second arrays comprises sequentially activating groups of the rows.

4. The method of claim 1 wherein the first and second arrays are in respective first and second memory banks.

5. A method of detecting intercell defects in a plurality of memory arrays that share the same sense amplifier, comprising the steps of:
   writing data to a first set of cells in the first memory array in a predefined pattern such that adjacent cells in the first set are at different voltage levels;
   writing data to a second set of cells in the second memory array in a predefined pattern such that adjacent cells in the second set are at different voltage levels;
   coupling the cells in a plurality of columns in a plurality of rows in the first memory array to a sense amplifier for each column so that the sense amplifier maintains the voltage on the memory cells in the first array;
   coupling the sense amplifier for each column to digit lines of the second memory array;
   coupling the cells in a plurality of columns in a plurality of rows in the second memory array to the sense amplifier for each column so that the sense amplifier for each column maintains the voltage on the memory cells in the second array;
   after a selected period of time, decoupling the memory cells from the sense amplifiers; and
   reading data from a plurality of memory cells in the first and second array that had not been coupled to a sense amplifier during the selected period of time.

6. The method of claim 5 wherein the step of writing data to a first set of cells in the first memory array comprises:
   coupling a cell in each of a plurality of columns to a digit line in the column;
   sensing the voltage of the digit line in each column using a plurality of respective sense amplifiers; and
   coupling a plurality of cells in each of a plurality of columns to respective digit lines.

7. A method of detecting intercell coupling in a plurality of arrays of memory cells arranged in rows and columns, wherein each array is defined by respective word lines and digit lines, the digit lines including inverting and non-inverting digit lines, comprising the steps of:
   prewriting a first selected group of cells in a first of the plurality of arrays to a first voltage level;
   establishing the first voltage level on a respective first set of digit lines coupled to the first selected group of cells;
   coupling voltages from the first set of digit lines to a second set of digit lines in the second array;
   coupling a second selected group of cells in the second array to the second set of digit lines; and
   after a testing interval, reading data from a third set of cells adjacent to the cells in the second set of cells.

8. The method of claim 7 wherein the first and second sets of digit lines are complementary digit lines where the first digit line has a true state at a first voltage level and the second digit line has a not true state at the first voltage level.

9. The method of claim 8, further including the step of, before the step of activating selected word lines to couple a second selected group of cells, prewriting the second selected group of cells to the first voltage.

10. The method of claim 8 wherein the step of establishing the first voltage level on a respective first set of digit lines includes the step of sensing cell voltages with sense amplifiers.

11. The method of claim 7 wherein the step of coupling voltages from the first set of digit lines to a second set of digit lines in the second array includes the step of activating isolation transistors coupled between the sense amplifiers and the second array.

12. A method of stressing memory cell nitride layers or repairing inter-cell defects extending between memory cells arranged in rows and columns in first and second memory arrays, the memory arrays further including a plurality of sense amplifiers shared by the first and second arrays in which each of the sense amplifiers are selectively coupled to a pair of complimentary digit lines of a respective column in the first and second arrays, the method comprising:
   coupling a memory cell in each of a plurality of columns to a respective sense amplifier through a respective digit lines of one of the first and second arrays to set the voltage of the digit lines for each of the plurality of columns;
   coupling each of the plurality of sense amplifiers to respective complimentary pairs of digit lines of the first array while isolating the sense amplifiers from respective pairs of digit lines of the second array;
   activating a plurality of rows in the first array to apply the voltage set on a digit line for the respective column to the memory cells in respective activated rows, the rows being activated so that at least some of the memory cells that are adjacent to each other are coupled to respective digit lines that have different complimentary voltages so that a voltage will be developed across any inter-cell defects that are between the adjacent memory cells;
   coupling each of the plurality of sense amplifiers to respective complimentary pairs of digit lines of the second array;
   activating a plurality of rows in the second array to apply the voltage set on a digit line for the respective column to the memory cells in respective activated rows, the rows being activated so that at least some of the memory cells that are adjacent to each other are coupled to respective digit lines that have different complimentary voltages so that a voltage will be developed across any inter-cell defects that are between the adjacent memory cells; and
   leaving the digit lines coupled to the memory cells in the activated rows of the first and second arrays for a period of sufficient duration for current flowing through inter-cell defects to open-circuit the inter-cell defects.

13. The method of claim 12 wherein the step of activating a plurality of rows in the first and second arrays comprises activating each of the rows in a sequence with only a single row being activated at a time.

14. The method of claim 12 wherein the step of activating a plurality of rows in the first and second arrays comprises sequentially activating groups of the rows.

15. The method of claim 12 wherein the first and second arrays are in respective first and second memory banks.

16. A method of establishing voltages on digit lines in first and second memory arrays that share a set of sense amplifiers in which the memory cells are arranged in rows and columns and the sense amplifiers are selectively coupled to a digit line of a respective column in the first and second arrays, the method comprising:

coupling a memory cell in each of a plurality of columns to a respective sense amplifier through a respective digit lines of one of the first and second arrays to set the voltage of the digit lines for each of the plurality of columns;

coupling each of the plurality of sense amplifiers to a respective pair of complimentary digit lines of the first array while isolating the sense amplifiers from respective digit lines of the second array; and coupling each of the plurality of sense amplifiers to a respective pair of digit lines of the second array.

17. The method of claim 16 wherein the first and second arrays are in respective first and second memory banks.

* * * * *

UNITED STATES PATENT AND TRADEMARK OFFICE
CERTIFICATE OF CORRECTION

PATENT NO. : 6,167,541
DATED : December 26, 2000
INVENTOR(S) : Siek et al.

It is certified that error appears in the above-identified patent and that said Letters Patent is hereby corrected as shown below:

Title page,
Line 2, "PREPARING" should read -- REPAIRING --
OTHER PUBLICATIONS "Dufot" should read -- Dufort --
ABSTRACT, last line "complimentary" should read -- complementary --
U.S. PATENT DOCUMENTS "6,111,947" should read -- 6,000,947 --

Column 10,
Line 62, "some the memory" should read -- some of the memory --

Column 12,
Lines 12, 20, 28, 33, and 41, "complimentary" should read -- complementary --
Line 15, "through a respective" should read -- through respective --

Column 13,
Line 5, "through a respective" should read -- through respective --

Column 14,
Line 2, "complimentary" should read -- complementary --

Signed and Sealed this

Eleventh Day of December, 2001

*Attest:*

NICHOLAS P. GODICI
*Attesting Officer*   *Acting Director of the United States Patent and Trademark Office*